United States Patent [19]

Narizuka et al.

[11] Patent Number: 5,320,729
[45] Date of Patent: Jun. 14, 1994

[54] SPUTTERING TARGET

[75] Inventors: Yasunori Narizuka, Hiratsuka; Masakazu Ishino, Yokohama; Akihiro Kenmotsu, Fijisawa; Yoshitaka Chiba, Yonago; Akitoshi Hiraki, Yasugi, all of Japan

[73] Assignee: Hitachi, Ltd., Tokyo, Japan

[21] Appl. No.: 914,469

[22] Filed: Jul. 17, 1992

[30] Foreign Application Priority Data

Jul. 19, 1991 [JP] Japan .................. 3-179207

[51] Int. Cl.$^5$ .............................. C23C 14/34
[52] U.S. Cl. .................... 204/298.13; 204/298.12; 501/53; 423/326
[58] Field of Search .............. 204/298.13, 192.17, 204/192.37; 501/55; 419/10

[56] References Cited

U.S. PATENT DOCUMENTS

| | | | |
|---|---|---|---|
| 4,157,315 | 6/1979 | Michels et al. | 502/245 |
| 4,466,940 | 8/1984 | Siewert et al. | 204/298.13 |
| 4,764,233 | 8/1988 | Ogihara et al. | 501/55 |
| 4,832,771 | 5/1989 | Hamamatu et al. | 501/55 |
| 4,917,722 | 4/1990 | Kuniya et al. | 419/43 |
| 4,963,240 | 10/1990 | Fukasawa et al. | 204/298.13 |
| 4,966,676 | 10/1990 | Fukasawa et al. | 204/298.12 |
| 5,118,661 | 6/1992 | Maeda | 204/298.13 |

Primary Examiner—Anthony McFarlane
Attorney, Agent, or Firm—Antonelli, Terry, Stout & Kraus

[57] ABSTRACT

Disclosed herein is a sputtering target with which a high resistivity thin film consisting of chromium, silicon and oxygen can be produced economically and stably for a long time. Also disclosed is a process for producing the sputtering target by selecting the grain size of a chromium (Cr) powder and a silicon dioxide ($SiO_2$) powder, drying the powders sufficiently by heating, then mixing the dried powders to obtain a mixed powder containing generally from 20 to 80% by weight of chromium, most preferably from 50 to 80% by weight of chromium, the remainder being silicon dioxide, packing the mixed powder in a die, and sintering the packed powder by hot pressing or the like, to produce a desired sputtering target which has a two phase mixed structure. The sputtering target can be used for manufacture of thin film resistors and electric circuits.

18 Claims, 3 Drawing Sheets 5,320,729

SPUTTERING TARGET

BACKGROUND OF THE INVENTION

This invention relates to a sputtering target used in sputtering to deposit a high resistivity thin film for forming resistor elements of a circuit, in the manufacture of a high-density wiring board suited to information processing systems such as electronic computers, electronic switching systems, etc.

High resistivity thin films consisting of chromium (Cr), silicon (Si) and oxygen (O) have been known to have a low temperature coefficient of resistance, be stable both thermally and chemically, and be of great use for forming thin film resistors. As a means for producing such a thin film, there is known a method of depositing the desired thin film by heating a mixture of a Cr powder and a silicon monoxide (SiO) powder with electron beams, as disclosed in J. Vac. Sci. Technol., 4 (1967), pp. 163–170.

Also, it is described, for example in Japanese Patent Application Laid-Open Nos. 54-1898 (1979) and 58-82770 (1983), that the aforementioned thin film can be obtained by reactive sputtering in an oxygen-containing atmosphere using a Cr-Si composite-type target or alloy target.

Furthermore, there is known an example of depositing the aforementioned thin film by using a mixture of a Cr powder and an $SiO_2$ powder directly as a sputtering target, as described in Thin Solid Films, 57 (1979), pp. 363–366.

Although different from the above exemplary methods in regard to the material system for forming the thin film, there is also known an example of using a sputtering target formed by pressing metallic tantalum (Ta) and $SiO_2$ powders and carrying out sputtering to obtain a thin film consisting of tantalum (Ta), silicon (Si) and oxygen (O), which is a known example of a metal-silicon-oxygen thin film, as is disclosed in Japanese Patent Application Laid-Open No. 58-119605 (1983).

Of the prior art examples mentioned above, those methods for depositing a thin film consisting of Cr, Si and O are, in the short run, satisfactory for obtaining the desired thin film. The methods, however, are not satisfactory with respect to reappearance characteristic of film characteristics in the long run, and lack considerations as to stability with time of obtaining the thin film; therefore, these methods tend to cause deviations of concentrations of film constituents, and are unsatisfactory for industrial use. On the other hand, in the example of a sputtering target formed from metallic Ta and $SiO_2$, the forming must be carried out at a temperature as low as possible, because high temperatures would cause reactions between tantalum and silicon and/or between tantalum and oxygen, resulting in a very brittle target. The requirement for forming at a low temperature leads to a low relative density of particles for forming thin film particles. Even with various countermeasures against this problem, the density of the thin film forming particles has been about 90% at best. Consequently, the presence of minute voids in the sputtering target obtained will cause variations in the distribution of voids on the surface and in the thickness direction of the target. Thus, the sputtering targets according to the prior art have problems yet to be solved as to reappearance characteristic (stability with time) on a long-term basis.

In addition, the presence of such greater voids as to be visible to the naked eye would cause localization of glow discharge during sputtering, thereby rendering the discharge unstable.

In order to obviate this problem, the relative density of the thin film forming particles should be raised to 90% or above. Use of a high pressure in pressing for forming the sputtering target, in order to obtain the high relative density, produces another problem that heat generation due for example to friction between particles during the pressing makes it impossible to hinder the progress of the aforementioned reactions. Therefore, the target material obtained in this manner is extremely brittle, and highly susceptible to cracking under the heat arising from electric discharge in deposition of a thin film by sputtering.

SUMMARY OF THE INVENTION

It is accordingly an object of this invention to provide a sputtering target which is suitable for mass production and with which a high resistivity thin film consisting of Cr, Si and O can be produced stably and in large quantities.

The above object is attained according to this invention by providing a sputtering target which comprises Cr, Si and O, is uniform in composition and has high mechanical strength, namely, high relative density. The sputtering target can be produced as follows. A powder of Cr and a powder of $SiO_2$, which is a stable oxide, are used as materials. The grain size of the material powders is selected to have a Tyler No. of 32 mesh under (particle diameter: 500 μm or below). After sufficient removal of moisture from the Cr and $SiO_2$ powders, the powders are mixed with each other to be a mixed powder of materials which contains from 20 to 80% by weight of Cr, preferably from 50 to 80% by weight of Cr, with the remainder being $SiO_2$. In order to prevent a reaction between Cr and Si from taking place under heating for forming, a Cr powder with a thin oxide film formed on the surfaces of Cr particles by a heat treatment may be mixed with $SiO_2$ powder to prepare the powder of materials. Thereafter, the mixed powder of materials is packed in a sealing can for pressing which is lined with a foil of a high melting point metal, such as niobium (Nb). While heating the sealing can at a temperature of from 200° to 800° C., the can is evacuated and then sealed. The powder of materials thus sealed in the sealing can is subjected to forming by hot isostatic pressing, to yield a sputtering target.

Alternatively, the mixed powder of materials is formed by ordinary pressing, then the formed body is placed in a die and formed by hot pressing to produce a sputtering target.

DESCRIPTION OF THE PREFERRED EMBODIMENT

Figure 1:
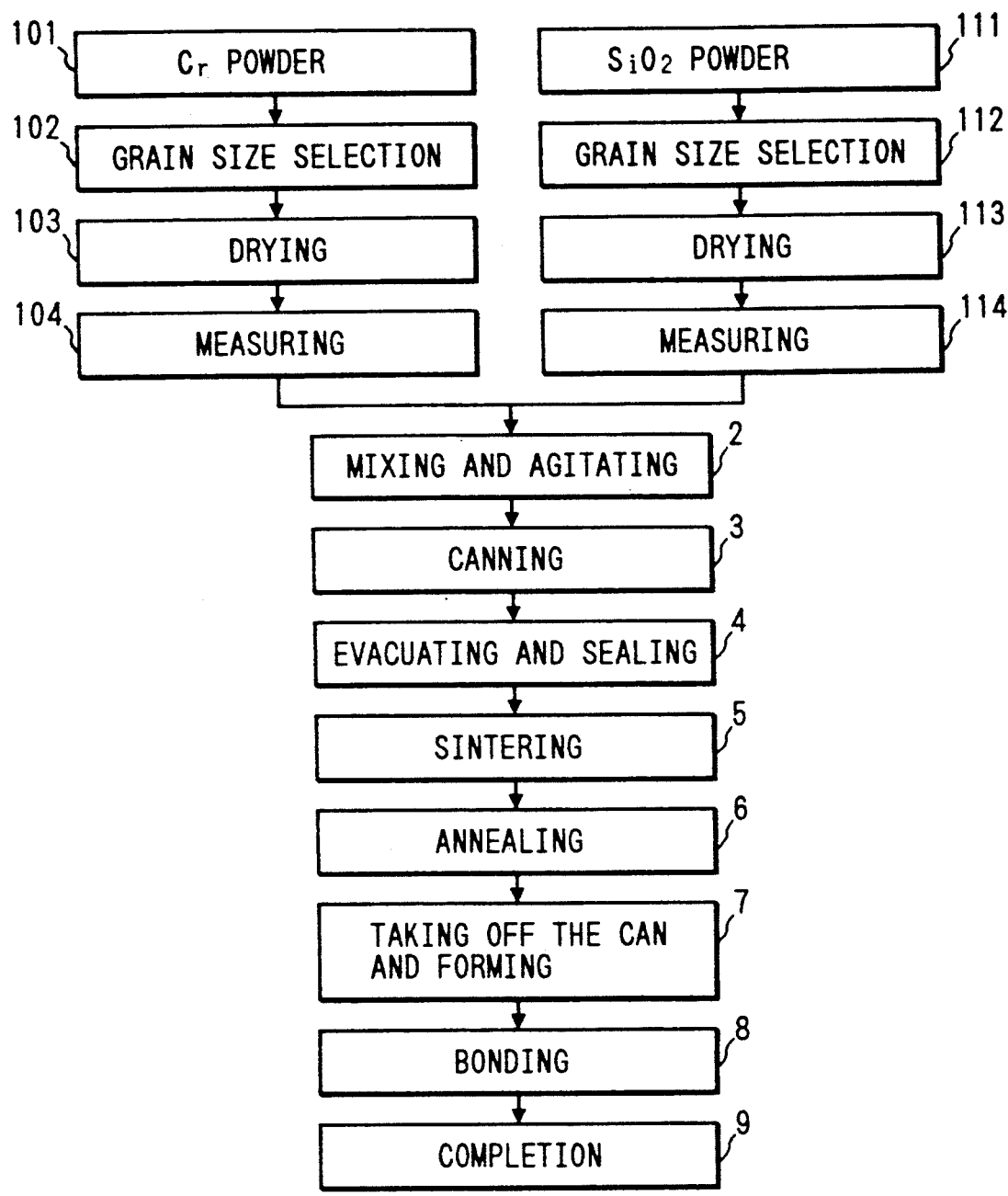
FIG. 1 is a drawing showing the production steps for a Cr-$SiO_2$ sintered target according to this invention.

In this invention, for example, a Cr powder and an SiO₂ powder are selected with respect to grain size so as to have a Tyler No. of 32 mesh under (particle size: 500 μm or below). The Cr and SiO₂ powders are mixed together so that the amount of Cr is from 20 to 80% by weight (in further effective cases, from 50 to 80% by weight) based on the total amount of the powders, followed by agitating the resulting mixture sufficiently, whereby a uniformly mixed powder of materials can be obtained. By use of the mixed powder of materials, it is possible to produce a sintered body with very little local variations of Cr/SiO₂ ratio. Due to the inherent property of chromium (Cr), simply leaving the Cr powder to stand in the atmospheric air causes formation of natural oxide film on the surfaces of the Cr particles. The oxide film ensures that chemical reactions between Cr and Si in SiO₂ is prevented even during the forming step carried out under high temperature and high pressure. As a result, a sintered body can be produced stably, without cracking due to the formation of brittle compounds or due to volume changes associated with the formation of compounds. This favorable effect on stable production can be further ensured when an oxide film is formed on the surfaces of the Cr particles by a heat treatment. Because both the Cr and SiO₂ powders are stable under pressing at high temperature, the SiO₂ particles located between the Cr particles are softened and flow to fill the voids between the Cr particles, during forming under a high temperature of about 1200° C. and a high pressure of 1000 kg/cm². As a result, a two phase mixed structure is formed in which the voids between the Cr particles have been substantially completely filled up with SiO₂. The sintered body having the two phase mixed structure exhibits a relative density of 95% or above. Besides, the Nb foil lining the sealing can for pressing serves as a diffusion barrier layer to prevent reactions between the material of the sealing can and the mixed powder of materials; if such a reaction occurred, constituent elements of the sealing can might penetrate into the press-formed product or it might be impossible to separate the sealing can from the surface of the press-formed product. A treatment for providing such a diffusion barrier layer should be applied also to the die which is used in the case of forming by hot pressing. Due to the total effect of these production processes, a sintered body can be obtained which is extremely uniform in structure, with very little local variations of Cr/SiO₂ ratio, and which has a relative density of 95% or above and, hence, a high mechanical strength. A thin film obtained by use of the sputtering target of this invention having the above-described characteristics is high in uniformity of distribution of film characteristics (e.g., resistance value) on substrate. With the sputtering target of this invention, further, it is possible to obtain the desired thin film with good reappearance characteristic of film characteristics over a long time.

Some preferred embodiments of this invention will now be described below with reference to the accompanying drawings.

EXAMPLE 1

As shown in FIG. 1, a Cr powder (101) of a purity of at least 99.5% and an SiO₂ powder of a purity of at least 99.5%, for use as materials, are subjected to grain size selection (102) (112) to have Tyler numbers of 120 mesh under and 200 mesh under, respectively. The Cr powder (101) has a comparatively low adsorptivity for moisture and, if stored with care after the grain size selection, the Cr powder may be used directly as a material powder. Where there is an apprehension that the Cr powder (101) may adsorb moisture during storage, assured drying or removal of moisture (103) can be achieved by heating the Cr powder with agitating at about 200° C. in the atmospheric air. This treatment also causes formation of an oxide film on the entire surfaces of the Cr particles, and the oxide film serves to securely prevent the reaction of Cr with SiO₂ at high temperatures. If the heating temperature for the drying is too high, for example above 300° C., severe oxidation of the surfaces of the Cr particles takes place, and the total oxygen content of the resulting target will be thereby affected. Therefore, the above-mentioned temperature range is suitable. The SiO₂ powder should necessarily be subjected to drying or water removal (113) by heating with agitating at or above 800° C. in the atmospheric air or in a drying atmosphere, e.g., nitrogen. The SiO₂ powder can contain around 10% by weight of water in the form of water of crystallization, depending on the preparation process thereof, and will adsorb a considerable amount of moisture from the atmospheric air during storage. Therefore, a drying treatment at such a high temperature as described above is indispensable to removing water from the SiO₂ powder as far as possible. Where an amount of water is left contained in the SiO₂ powder, the water is turned into water vapor under a high temperature of around 1000° C. in sintering, whereby the Cr powder is excessively oxidized to become a brittle oxide. In such a situation, the intended sintering is practically impossible.

Respective measured amounts of the Cr powder and the SiO₂ powder treated in the manner as above were sufficiently mixed (2), to obtain a powder of materials. With compositions in which the proportions of the material powders differ greatly from each other, such as compositions having a Cr-mixing ratio of less than 20% or more than 80% by weight, it is difficult to accomplish uniform mixing of the material powders, and the resulting sputtering target tends to show a local deviation of Cr or SiO₂ concentration. From this point of view, the composition of the sputtering target should be in such a range that the Cr concentration is from 20 to 80% by weight. The mixed powder of materials is canned (3), namely, packed in a steel-made sealing can for pressing which is lined with a foil of niobium (Nb) or tantalum (Ta) several tens of micrometers in thickness, for inhibiting the sealing can from alloying or other reactions with the mixed powder of materials under high-temperature high-pressure conditions. The sealing can is then evacuated to remove air therefrom over several hours while heating at a temperature of from 200° to 800° C. Although the evacuation can be accomplished in a shorter time and more securely as the temperature is higher, a heating temperature of above 800° C. will cause sublimation of Cr. Therefore, the heating temperature should be in the above range. The evacuation is preferably carried out until the pressure inside the sealing can is lowered to or below 0.01 Pa. Where the pressure in the sealing can is 0.001 Pa or below, a sufficient preventive effect is obtained on excessive oxidation in sintering due to residual air and moisture, and a sputtering target can be obtained with good reappearance characteristic of target characteristics. After the evacuation is completed, the sealing can is sealed (4) by welding, followed by sintering (5) under a temperature of from 1000° to 1400° C. and a pressure of from 1000 to 1200 kg/cm² by hot isostatic pressing. The sintering is followed by gradual cooling (6) to room temperature over a period of 10 hours or more. After the cooling is over, the sealing can for pressing is mechanically cut to take (7) the sintered formed body off the can. Through the sintering step, the volume of the sealing can is reduced by about 10 to 20%. The relative density of the sintered formed body obtained in the manner as above was measured, and found to be 98%. The sintered formed body is then mechanically processed into a predetermined shape, and washed with an organic solvent and pure water or the like, followed by drying. For ease of mounting in a sputtering apparatus, the target is adhered (8) to a backing plate, thereby completing (9) the sputtering target.

EXAMPLE 2

Where the grain size of the material powders is controlled to be 30 mesh under for the Cr powder and 200 mesh under for the $SiO_2$ powder, a sputtering target can be produced by the same steps as those in Example 1. The target produced in this manner, however, showed conspicuous local deviations of the distribution of the Cr powder and had a relative density of about 96%, which is slightly lower than that obtained in Example 1. In using the sputtering target, therefore, sufficient care should be given to reappearance characteristic of film characteristics. The sputtering target was usable, with appropriate control of film deposition conditions according to variations in film characteristics.

EXAMPLE 3

Material powders are prepared and uniformly mixed (2) with each other in a desired ratio, in the same manner as in Example 1. The resulting mixed powder of materials is packed (3) in a mold, followed by forming by pressing under a pressure of about 400 kg/cm². The formed body thus obtained is placed in a carbon vessel, which is then evacuated to a vacuum of 0.01 Pa and sealed (4). Thereafter, a pressure of about 260 kg/cm² was applied to the formed body in the carbon vessel through a boron nitride-coated carbonaceous spacer, under a 1300° C. temperature (5), and the pressing condition was maintained for about 2 hours. By this process, also, it was possible to obtain a sputtering target equivalent to that obtained in Example 1.

In this production process, sintering under a lower pressure gives a sputtering target with a lower relative density. When a sputtering target with a relative density of about 80% was prepared by this process and subjected to electric discharge with a power density of 3.0 W/cm², the target was cracked after subjected to the discharge for several minutes. Thus, the target was unsuitable for practical use. On the other hand, sputtering targets with a relative density of 95% or above, whether they were produced by this process or by any of the processes described in Examples 1 and 2, were all free of tendency to breakage under electric discharge.

EXAMPLE 4

Figure 2:
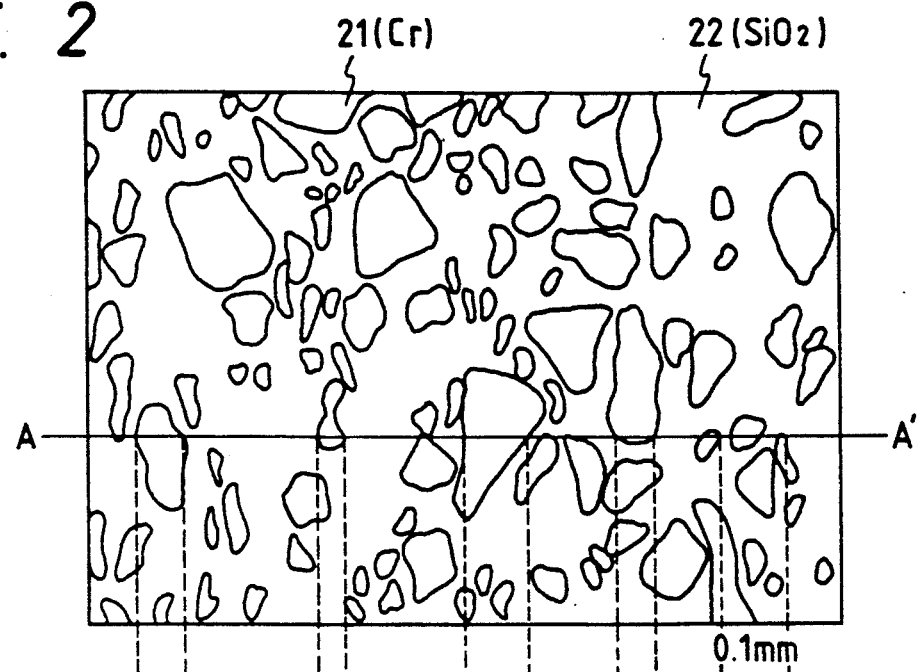
FIG. 2 is a drawing showing a microstructure of the Cr-$SiO_2$ according to this invention.
Figure 3:
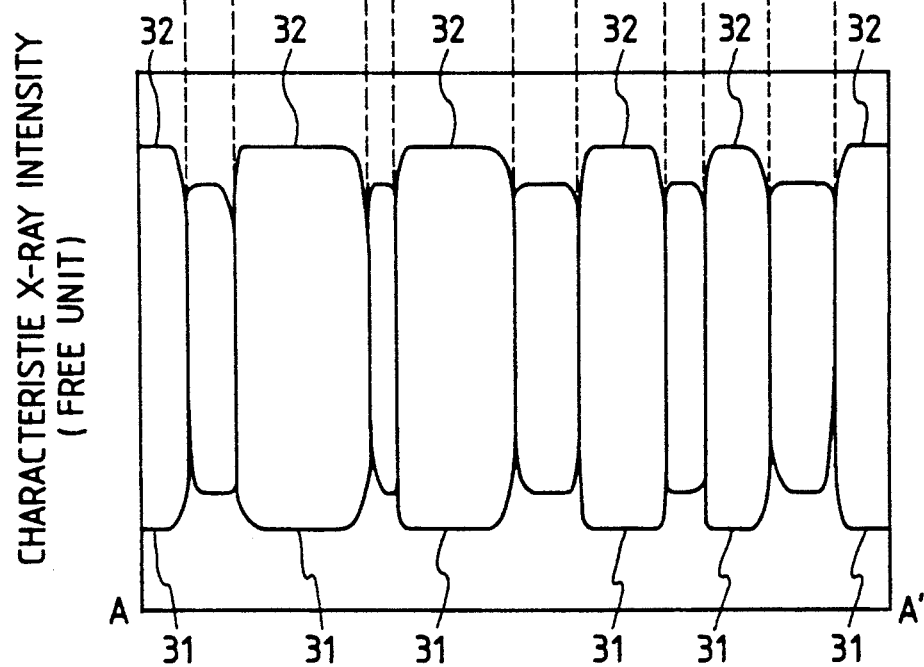
FIG. 3 is a sectional view showing the results of fluorescent X-ray analysis along line A—A' of FIG. 2.

When the surfaces of sputtering targets with a composition of 66 wt. % Cr-34 wt. % $SiO_2$ obtained in Examples 1, 2 and 3 are polished and observed under an optical microscope, the surfaces are seen to have a structure in which Cr particles (21) are dispersed in a matrix of $SiO_2$ (22), as shown in FIG. 2. The structure is formed because the $SiO_2$ (22) acquires flowability under high-temperature high-pressure conditions, to flow into the voids between the Cr particles (21), thereby filling up the voids substantially completely. When a sample having such a structure is analyzed by X-ray fluorometry, it is found that, as shown in FIG. 3, the characteristic X-ray intensity (31) of Cr (21) and the characteristic X-ray intensity (32) of $SiO_2$ (22) alternate with each other showing steep leading and trailing edges, at each boundary between the Cr particle (21) and the $SiO_2$ matrix (22). This indicates the presence of definite boundary between the Cr phase and the $SiO_2$ phase, without any interdiffusion. This is probably because the natural oxide film or thermal oxide film on the surfaces of the Cr particles served as a barrier against interdiffusion under the high-temperature high-pressure conditions in the sintering step. Measurement of the relative density of the sintered bodies having such a structure (theoretical density 4.06 g/cm³) gave relative density values of around 98%, which are sufficiently high.

EXAMPLE 5

Sputtering targets were produced by use of the same sintering conditions but with the grain sizes of Cr and $SiO_2$ powders varied. A comparison of these targets in regard to mechanical strength is shown in Table 1. As seen from the table, mechanical strength depends on the grain size of the Cr powder, and the target is more brittle as the Cr grain size is larger. Under the condition of sample number S1 given in the table, the target material cracked in he mechanical processing step after sintering, so that evaluation of sputtering target performance was impossible. On the other hand, a rectangularly shaped sputtering target produced under the conditions of sample number S2 in the table was found to be usable, without any trouble, when a load of an RF power with 3.1 W/cm² powder density for developing a glow discharge was applied to the target over a total period of 200 hours. It is evident from these results that the upper limit for the grain size of the Cr powder lies between sample S1 and sample number S2, and Cr powders finer than the sample number S2 can be used satisfactorily.

Besides, where the grain sizes of Cr and $SiO_2$ powders are large, the resulting formed body shows large local deviations of Cr/$SiO_2$ mixture ratio, leading to poor reappearance characteristic of thin-film characteristics. From this point of view, the grain sizes of the Cr and $SiO_2$ powders for use as materials should be finer than 32 mesh. Furthermore, the grain size of the $SiO_2$ powder should be equal to or smaller than the grain size of the Cr powder, from the viewpoint of uniform mixing. However, if the grain size of the Cr powder is reduced excessively, the mechanical strength of the sputtering target is saturated; in addition, adverse effects of the increased surface are of the Cr particles, such as an increase in the amount of oxide layer on the Cr particles, leading to a larger oxygen content of the target than intended, a relative increase in impurity contents etc., become more conspicuous. Accordingly, use of a Cr powder finer than a Tyler No. of 1000 mesh under has no merits. As for the SiO$_2$ powder, also, a grain size smaller than the Tyler No. of 1000 mesh under has no advantages, because a finer powder adsorbs a larger quantity of moisture and shows more conspicuous aggregation of particles, to yield the same results as those obtained with ar relatively coarser powder on an effective basis. Thus, in practical production of a sputtering target, the most preferable grain size in view of the impurity contents and ease of handling of the powder of material and the characteristics of the resulting target is from 32 to 1000 mesh under, for both the Cr and SiO$_2$ powders.

TABLE 1

| Sample number | S1 | S2 | S3 | S4 |
|---|---|---|---|---|
| Cr powder grain size (mesh number) | 32~60 | ≦32 | ≦120 | ≦325 |
| mechanical strength (strength or weakness) | weak | slightly | strong | strong |

EXAMPLE 6

Figure 4:
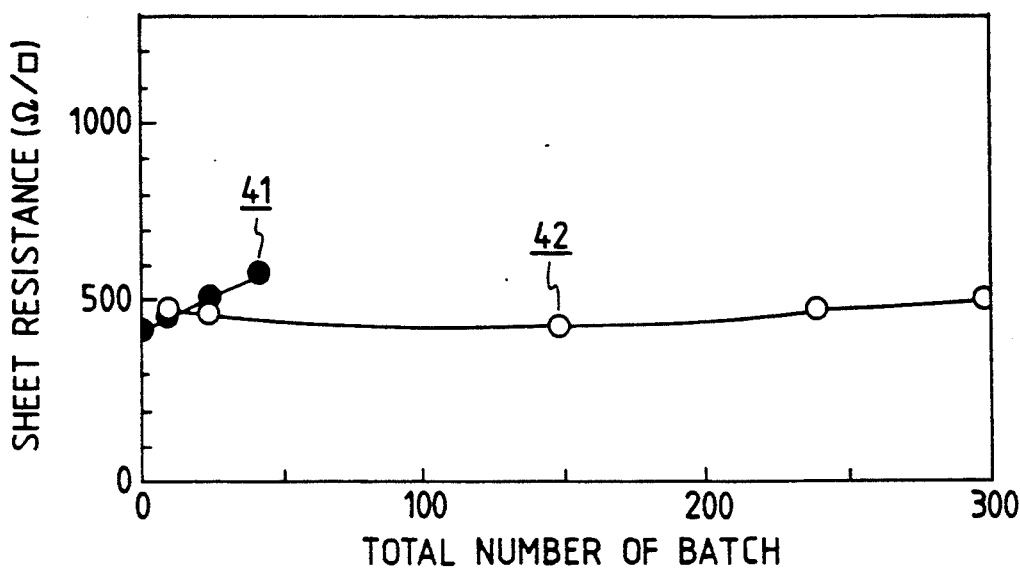
FIG. 4 is a diagram for comparing variation of resistivity in use of a sintered target according to this invention with that of a composite-type target of the same shape.

A Cr-SiO$_2$ sintered target of rectangular shape, measuring 127×381 mm, was produced. The target was mounted in a deposition with substrate moving type sputtering apparatus, and a thin film was deposited by an electric discharge with an RF power of 1.5 kW. The distribution of sheet resistance of the thin film thus obtained was within ±3% on 127 mm square substrate. With the sputtering apparatus, reappearance characteristic of deposition phenomenon under fixed film deposition conditions was examined. The results are shown in FIG. 4, in terms of the relationship between total number of batches and average sheet resistance. A corresponding relationship obtained with a composite-type target prepared by combining a Cr plate and an SiO$_2$ plate and having the same outer shape as the Cr-SiO$_2$ sintered target is also shown in FIG. 4, represented by a line 41 connecting the solid circles which indicate measured values. The line (41) indicates the variation of sheet resistance of the thin film with wear (consumption) of the composite-type target. The values indicated by the solid circles show a comparatively rapid increase of sheet resistance with an increase in the total number of batches. Therefore, the number of batches within which a thin film having the aforesaid sheet resistance and distribution characteristics can be obtained is no more than about 20 batches (in this case, the sheet resistance is 500 Ω/□).

On the other hand, in the example using the sputtering target according to this invention, as indicated by a line 42 connecting the open circles in FIG. 4, the number of batches yielding satisfactory results was 300 batches or more (measured values for total batch numbers of above 300 are omitted). Thus, a great improvement in mass-production properties was confirmed. Throughout these investigations, the sintered targets showed no sign of breakage by electric discharge. This verified the appropriateness of the above-described settings of the production conditions.

EXAMPLE 7

Figure 5:
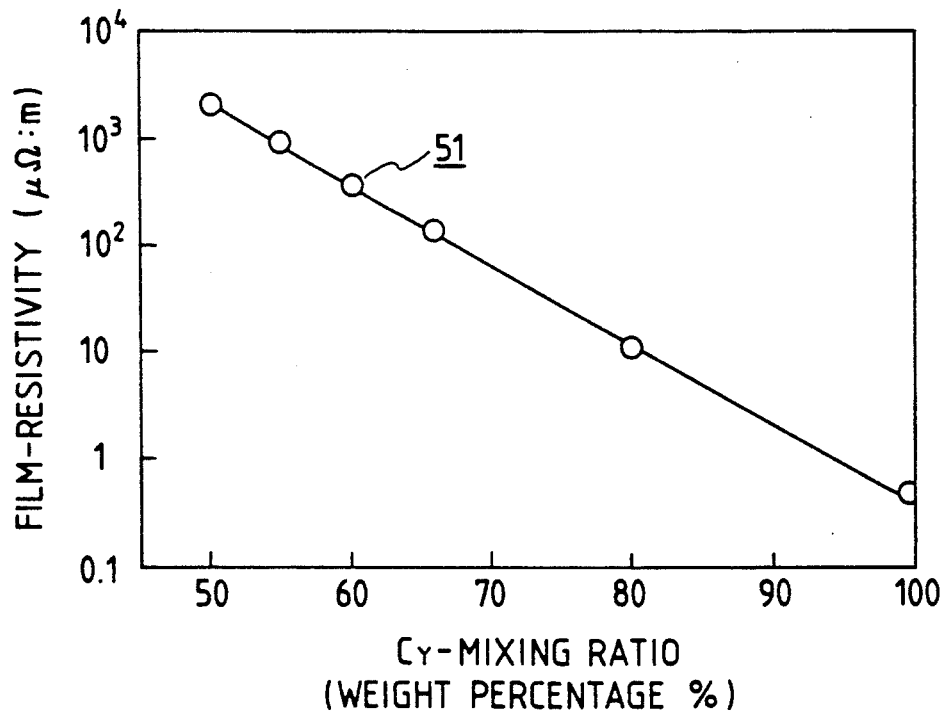
FIG. 5 is a diagram showing the dependence of film resistivity on Cr-mixing ratio, for thin films obtained by use of sintered targets prepared with the Cr-SiO₂ mixture ratio varied.

Sputtering targets were produced with the mixing ratio of Cr and SiO$_2$ powders varied in the range from 55 wt. % Cr to 80 wt. % Cr. The targets were used in RF sputtering to deposit Cr—Si—O thin films. The resistivity of the thin films in the as-deposited condition is shown in FIG. 5. As is seen from the figure, a thin film having a resistivity of 10 μΩ·m, a value comparable to that of a commonly known NiCr (nichrome) thin film, can be obtained by use of a sputtering target with an 80 wt. % Cr composition according to this invention. Furthermore, thin films in a high-resistivity region which have been difficult to obtain stably by the prior art can be obtained easily and over a wide range by increasing the amount of SiO$_2$. From the viewpoint of resistivity of the thin films thus obtained, the composition range of from 50 wt. % Cr to 80 wt. % Cr is particularly suitable for the sputtering target. If the Cr content is less than 20% by weight, the resulting thin film is a substantially insulating material, which is outside the object of this invention. Thus, the considerations of the characteristics of thin films obtained also indicate that the composition of the sputtering target according to this invention should be in the range from 20 wt. % Cr to 80 wt. % Cr. Within the range, a particularly preferable range is from 50 wt. % Cr to 80 wt. % Cr.

As has been described above, according to this invention, it is possible to obtain a sputtering target which is uniform in structure, without deviations of Cr/SiO$_2$ mixture ratio. Besides, the target according to this invention has high mechanical strength and is capable of enduring electric discharge over a long time. According to the invention, therefore, it is possible to obtain a sputtering target having a useful life of at least 10 times the useful life of conventional targets. Furthermore, by use of the sputtering target according to this invention, a thin film having a desired resistivity can be obtained with slight distribution of film characteristics on a substrate and with good reappearance characteristic of film characteristics. Accordingly, where such a thin film is deposited as a resistor, errors in the electric resistance of the resistor can be reduced, and a thin-film circuit can be fabricated with markedly improved circuit characteristics.

What is claimed is:

1. A sputtering target comprising a sintered solid, said sintered solid containing from 20 to 80% by weight of metallic chromium (Cr), the remainder being silicon dioxide (SiO$_2$).

2. A sputtering target comprising a sintered solid, said sintered solid containing from 50 to 80% by weight of metallic chromium (Cr), the remainder being silicon dioxide (SiO$_2$).

3. The sputtering target according to claim 1, wherein the ratio of the actual density of the target to the theoretical density of the composition of the target (relative density) is 95% or above.

4. The sputtering target according to claim 2, wherein the ratio of the actual density of the target to the theoretical density of the composition of the target (relative density) is 95% or above.

5. The sputtering target according to claim 1 which has a two phase mixed structure comprising metallic chromium (Cr) particles, said chromium (Cr) particles having a particle diameter of 500 μm or below and having voids therebetween, and silicon dioxide (SiO$_2$) filling said voids between said chromium (Cr) particles.

6. The sputtering target according to claim 2 which has a two phase mixed structure comprising metallic chromium (Cr) particles, said chromium (Cr) particles having a particle diameter of 500 μm or below and having voids therebetween, and silicon dioxide ($SiO_2$) filling said voids between said chromium (Cr) particles.

7. The sputtering target according to claim 3 which has a two phase mixed structure comprising metallic chromium (Cr) particles, said chromium (Cr) particles having a particle diameter of 500 μm or below and having voids therebetween, and silicon dioxide ($SiO_2$) filling said voids between said chromium (Cr) particles.

8. The sputtering target according to claim 4 which has a two phase mixed structure comprising metallic chromium (Cr) particles, said chromium (Cr) particles having a particle diameter of 500 μm or below and having voids therebetween, and silicon dioxide ($SiO_2$) filling said voids between said chromium (Cr) particles.

9. A sputtering target according to claim 1, wherein said sintered solid is formed by selecting metallic chromium (Cr) particles and silicon dioxide ($SiO_2$) particles having particle diameters of 500 μm or below; mixing said metallic chromium (Cr) particles and said silicon dioxide ($SiO_2$) particles to obtain mixed particles; packing said mixed particles into a sealing can lined for prevention of reaction of said sealing can with said mixed particles; evacuating said sealing can; and sintering said mixed particles in said sealing can by hot isostatic pressing.

10. A sputtering target according to claim 2, wherein said sintered solid is formed by selecting metallic chromium (Cr) particles and silicon dioxide ($SiO_2$) particles having particle diameters of 500 μm or below; mixing said metallic chromium (Cr) particles and said silicon dioxide ($SiO_2$) particles to obtain mixed particles; packing said mixed particles into a sealing can lined for prevention of reaction of said sealing can with said mixed particles; evacuating said sealing can; and sintering said mixed particles in said sealing can by hot isostatic pressing.

11. A sputtering target according to claim 10, wherein said metallic chromium (Cr) particles and said silicon dioxide ($SiO_2$) particles each has a grain size in terms of Tyler No. of 32 to 1000 mesh under and wherein the grain size of said silicon dioxide ($SiO_2$) particles is equal to or smaller than the grain size of said metallic chromium (Cr) particles.

12. A sputtering target according to claim 9, wherein said metallic chromium (Cr) particles and said silicon dioxide ($SiO_2$) particles each has a grain size in terms of Tyler No. of 32 o 1000 mesh under and wherein the grain size of said silicon dioxide ($SiO_2$) particles is equal to or smaller than the grain size of said metallic chromium (Cr) particles.

13. A sputtering target according to claim 1, wherein said sintered solid is formed by selecting metallic chromium (Cr) particles and silicon dioxide ($SiO_2$) particles having particle diameters of 500 μm or below; mixing said metallic chromium (Cr) particles and said silicon dioxide ($SiO_2$) particles to obtain mixed particles; forming a body of the resulting mixed particles by pressing; placing the formed body in a die treated to have a barrier against diffusion; and sintering the formed body by hot pressing.

14. A sputtering target according to claim 2, wherein said sintered solid is formed by selecting metallic chromium (Cr) particles and silicon dioxide ($SiO_2$) particles having particle diameters of 500 μm or below; mixing said metallic chromium (Cr) particles and said silicon dioxide ($SiO_2$) particles to obtain mixed particles; forming a body of the resulting mixed particles by pressing; placing the formed body in a die treated to have a barrier against diffusion; and sintering the formed body by hot pressing.

15. A sputtering target according to claim 14, wherein said metallic chromium (Cr) particles and said silicon dioxide ($SiO_2$) particles each has a grain size in terms of Tyler No. of 32 to 1000 mesh under and wherein the grain size of said silicon dioxide ($SiO_2$) particles is equal to or smaller than the grain size of said metallic chromium (Cr) particles.

16. A sputtering target according to claim 13, wherein said metallic chromium (Cr) particles and said silicon dioxide ($SiO_2$) particles each has a grain size in terms of Tyler No. of 32 to 1000 mesh under and wherein grain size of said silicon dioxide ($SiO_2$) particles is equal to or smaller than the grain size of said metallic chromium (Cr) particles.

17. A sputtering target according to claim 9, wherein said metallic chromium (Cr) particles are provided with an oxide film on surfaces thereof prior to said mixing of said metallic chromium (Cr) particles with said silicon dioxide ($SiO_2$) particles.

18. A sputtering target according to claim 10, wherein said metallic chromium (Cr) particles are provided with an oxide film on surfaces thereof prior to said mixing of said metallic chromium (Cr) particles with said silicon dioxide ($SiO_2$) particles.

* * * * *